(12) United States Patent
Fan

(10) Patent No.: US 6,853,944 B2
(45) Date of Patent: Feb. 8, 2005

(54) JUNCTION TEMPERATURES MEASUREMENTS IN SEMICONDUCTOR CHIP PACKAGE TECHNOLOGY

(75) Inventor: Xuejun Fan, Croton-on-Hudson, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/282,450

(22) Filed: Oct. 29, 2002

(65) Prior Publication Data

US 2004/0083075 A1 Apr. 29, 2004

(51) Int. Cl.[7] .......................... G01K 1/00; G01K 15/00; G01K 7/00; G01N 25/72
(52) U.S. Cl. ............................ 702/130; 702/99; 374/1; 374/5; 374/178
(58) Field of Search ...................... 702/99, 130; 374/1, 374/4, 5, 30, 137, 178; 327/512, 513; 73/204.24; 438/15

(56) References Cited

U.S. PATENT DOCUMENTS 6,203,191 B1 * 3/2001 Mongan ...................... 374/43

* cited by examiner

Primary Examiner—John Barlow
Assistant Examiner—Meagan S Walling
(74) Attorney, Agent, or Firm—Peter Zawilski

(57) ABSTRACT

A need exists in the art for a method of generating junction temperatures for multiple-chip packages that takes into account the non-linearity of thermal systems, improves accuracy, and allows more than one multiple-chip package to be measured without again determining the power distribution ratio of each device. To meet this need, the invention includes a method of generating junction temperatures in a multiple-chip package by heating a single chip in the multiple-chip package, measuring the change in temperature of each chip in the multiple-chip package, storing the measured temperature change of each chip, and repeating the heating, measuring, and storing steps for each chip in the multiple-chip package. The invention generates the junction temperatures of each chip in the multiple-chip package when each chip is operating simultaneously based on the stored measured temperature changes and accounting for a non-linearity in a thermal system of the multiple-chip package based on power dissipation ratios of each chip.

11 Claims, 4 Drawing Sheets

JUNCTION TEMPERATURES MEASUREMENTS IN SEMICONDUCTOR CHIP PACKAGE TECHNOLOGY

FIELD OF THE INVENTION

The invention relates to the field of junction temperature measurements in semiconductor chip package technology.

BACKGROUND OF THE INVENTION

Electronic devices utilizing semiconductor chips are mounted on substrates that physically support the chips and electrically transmit signals between the chips and other elements of the circuit. This configuration is referred to as a package. Often, more than one chip or electronic assembly is included in a single package. Such multi-chip packages 1, as shown in FIG. 1, contain multiple semiconductor components (elements 2, 3, 4) in close proximity, each with independent heat dissipations. Each component also heats the adjacent components. The relative heat dissipation of each component is a function of the component's operation. Thus, it is important to accurately test the thermal resistance characterizations of multiple-chip packages having multiple heat sources in a test-mode. The junctions between the components in a multiple-chip package offer many useful properties, such as the capability to measure temperatures deep inside solid-state devices without direct mechanical or optical contact.

Existing test systems currently available only work well with single-chip packages. Such systems, as described in Dr. John W. Sofia's article "ELECTRICAL TEMPERATURE MEASRUEMENT USING SEMICONDUCTORS" (ElectronicsCooling, v. 3, no. 1, January 1997) herein incorporated by reference, measure junction-temperatures in single-chip packages by measuring a temperature-sensitive parameter (commonly known as "TSP") of a device. TSPs can include diode forward voltage (i.e., for diodes, ICs, bipolar transistors, MOSFETs, etc.), saturation voltage (i.e, for bipolar transistors), and gate turn-on threshold (i.e., for bipolar transistors). Once an appropriate TSP is chosen, the relationship between the electrical entity and temperature is determined through device calibration by any method known in the art. Device calibration involves forcing the semiconductor to a known temperature and then measuring the TSP voltage associated with that temperature. This generates a linear calibration equation. Once this formula is determined, measurements of thermal impedances and resistances associated with single-device packages can be performed by measuring the junction temperature response to a measured heat dissipation from within the device, as shown in FIG. 2.

For multiple-chip packages, current test systems can only power one device at a time. Thus, direct measurement of junction temperatures for multiple-chip packages is not currently available.

Current test systems employ a linear superposition approach to obtain the junction temperatures for multiple-chip packages in a test-mode based on individual device test results. This method can be best understood in reference to FIGS. 3A–3C. In FIG. 3A, a theoretical device which contains two internal heat sources is insulated everywhere but at the points where a fixed temperature is imposed. When only a single heat source 1 is operating, the temperature at point $T_1$ equals $T_{11}$ and at point $T_2$ equals $T_{21}$. In FIG. 3B, when heat source 2 is operating and heat source 1 is not, the temperature at point $T_1$ equals $T_{12}$ and at point $T_2$ equals $T_{22}$. Using the method of linear superposition, the solution in FIG. 3C can be simply created by adding the temperature rises from each single source.

The method of superposition can be expressed as a matrix of thermal resistance formulations for multiple heat source thermal problems generated using the single-chip package measurement technique. In the theoretical example shown in FIGS. 3A–3C, the device is insulated everywhere but where a fixed temperature is imposed. Assuming that these uninsulated points are exposed to an infinite heat sink of temperature $T_0$, the reference temperature is the infinite heat sink temperature, i.e., $T_{ref}=T_0$. Superimposing FIGS. 3A and 3B, the temperature rise of point 1 equals the temperature rise of point 1 with only the heat source at point 1 operating plus the temperature rise of point 1 with only the heat source 2 operating, thus:

$$T_1=(T_{11}-T_0)+(T_{12}-T_0)+T_0$$
$$T_2=(T_{21}-T_0)+(T_{22}-T_0)+T_0$$

where the single-source temperatures are defined:
- $T_{11}$=temperature of point 1 with heating from point 1
- $T_{22}$=temperature of point 2 with heating from point 2
- $T_{12}$=temperature of point 1 with heating from point 2
- $T_{21}$=temperature of point 2 with heating from point 1 and the superimposed temperatures are:
- $T_1$=temperature of point 1 due to heat from both point 1 and point 2;
- $T_2$=temperature of point 2 due to heat from both point 1 and point 2.

The superposition solution can be expressed in terms of thermal resistances:

$$R_{11}=\frac{T_{11}-T_0}{Q_1}$$

Where all thermal resistences are from the heat source "junctions" to the reference temperature $T_{ref}$ or $T_0$. This yields a 2 by 2 matrix, $|R|$:

$$\begin{vmatrix} R_{11} & R_{12} \\ R_{21} & R_{22} \end{vmatrix} \begin{vmatrix} Q_1 \\ Q_2 \end{vmatrix} * \begin{vmatrix} T1-T0 \\ T2-T0 \end{vmatrix}$$

thus:

$$|R|*|Q|=|\Delta T|$$

The general thermal resistance description of a component having 'N' heat sources is an N-by-N matrix, $|R|$. The heat dissipation of each source is formed into a column matrix, $|Q|$. The differences between the source temperatures and the reference temperatures also form a column matrix $|\Delta T|$, where with the elements of the array are equal to $T_i-T_{ref}$ for I=1 to N. With the thermal resistance matrix determined, the temperature of each source can be calculated from the matrix equation based on the principle of superposition.

The known method of linear superposition fails to take into account the non-lienarity of thermal systems and the error between this test-mode method and actual results (i.e., in operating mode) can be as high as 20% in most cases. In addition, the power distribution ratio of each device in a multiple-chip package under test must be separately measured. Further, direct measurement of junction temperatures for multiple-chip packages requires the development of complicated hardware systems, which is quite costly.

SUMMARY OF THE INVENTION

Thus a need exists in the art for a method of generating junction temperatures for multiple-chip packages that takes into account the non-linearity of thermal systems, improves accuracy, and allows more than one multiple-chip package to be measured without again determining the power distribution ratio of each device. To meet this need, the invention includes, in one aspect, a method of generating junction temperatures in a multiple-chip package. This method includes several steps. One step is heating a single chip in the multiple-chip package. Another step is measuring the change in temperature of each chip in the multiple-chip package. Another step is storing the measured temperature change of each chip. Another step is repeating the heating, measuring, and storing steps for each chip in the multiple-chip package. Another step is generating the junction temperatures of each chip in the multiple-chip package when each chip is operating simultaneously based on the stored measured temperature changes and accounting for a non-linearity in a thermal system of the multiple-chip package based on power dissipation ratios of each chip.

In one embodiment, the heating step includes passing a current through the single chip.

In one embodiment the measuring step includes measuring a temperature sensitive parameter of each chip. In another embodiment, the measuring step includes passing a sensing current through each chip and measuring the voltage. In another embodiment, the measured voltage is converted into a temperature measurement.

In one embodiment, the generating step includes calculating the junction temperature of each chip in the multiple-chip package when each chip is operating simultaneously by using an algorithm. In another embodiment, the generating step includes calculating the junction temperature of each chip in the multiple-chip package when each chip is operating simultaneously by compiling single-source temperatures from the stored measured temperatures. In yet another embodiment, the single-source temperatures include a combination of multiple individual temperature rises of a single chip occurring when each chip is separately powered to give off heat during the heating, measuring, and repeating steps.

In another embodiment the single-source temperatures include multiplying each temperature rise of a single chip by the power dissipation ratio of the chip which is separately powered to give off heat. The single-source temperatures are entered into the algorithm and the junction temperature of each chip in the multiple-chip package when each chip is simultaneously operating is extracted in another embodiment of the invention.

Another aspect of the invention includes a method of analyzing the dependence of junction temperatures in a multiple-chip package on power distribution ratios from a test-mode. This method includes several steps. One step is heating a single chip in the multiple-chip package, one step is measuring the change in temperature of each chip in the multiple-chip package, and one step is storing the measured temperature change of each chip. The heating, measuring, and storing steps are repeated for each chip in the multiple-chip package. Another step is generating the junction temperatures of each chip in the multiple-chip package from the stored measured temperature changes and accounting for a non-linearity in a thermal system of the multiple-chip package based on a first power dissipation ratio of each chip. Another step is generating the junction temperatures of each chip in the multiple-chip package from the stored measured temperature changes and accounting for a non-linearity in a thermal system of the multiple-chip package based on a second power dissipation ratio of each chip.

The invention provides many advantages that are evident from the following description, drawings, and claims.

BRIEF DESCRIPTION OF THE DRAWINGS

The invention can be better understood in reference to the following drawings.

DETAILED DESCRIPTION OF THE PRIMARY EMBODIMENT

The prior art method of linear superposition may be applied to thermal resistance characterization and measurement of components with multiple, independent heat sources within a package. For example, a given package consists of a synchronous field effect transistor (or "FET"), a control FET, and a driver integrated circuit (or "IC") chip. First, the following single-source junction temperatures are measured and defined, $\Delta T_{11}$: temperature rise of synchronous FET with aP W heating from synchronous FET $\Delta T_{21}$: temperature rise of control FET with aP W heating from synchronous FET $\Delta T_{31}$: temperature rise of driver IC chip with aP W heating from synchronous FET $\Delta T_{12}$: temperature rise of synchronous FET with bP W heating from control FET $\Delta T_{22}$: temperature rise of control FET with bP W heating from control FET $\Delta T_{32}$: temperature rise of driver IC chip with bP W heating from control FET $\Delta T_{13}$: temperature rise of synchronous FET with cP W heating from driver IC $\Delta T_{23}$: temperature rise of control FET with cP W heating from driver IC $\Delta T_{33}$: temperature rise of driver IC chip with cP W heating from driver IC where P is the total amount of power dissipation for three chips, a, b and c are the percentage ratio of power dissipation by three chips respectively, and a+b+c=1. $\Delta T_{ij}$ (i,j=1,2,3), the junction temperature rise matrix, can be obtained from the measurement. The junction temperatures with heating from three chips simultaneously, i.e., aP W(synchronous FET)/bP W(control FET)/cP W(driver IC), can then determined by linear superposition as the following equation 1:

$$\Delta T_1 = \Delta T_{11} + \Delta T_{12} + \Delta T_{13}$$

$$\Delta T_2 = \Delta T_{21} + \Delta T_{22} + \Delta T_{23}$$

$$\Delta T_3 = \Delta T_{31} + \Delta T_{32} + \Delta T_{33} \quad \text{(Equation 1)}$$

where the $\Delta T_1$, $\Delta T_2$ and $\Delta T_3$ are the junction temperature rises for synchronous FET, control FET and driver IC, respectively, with powering three simultaneously.

Figure 1:
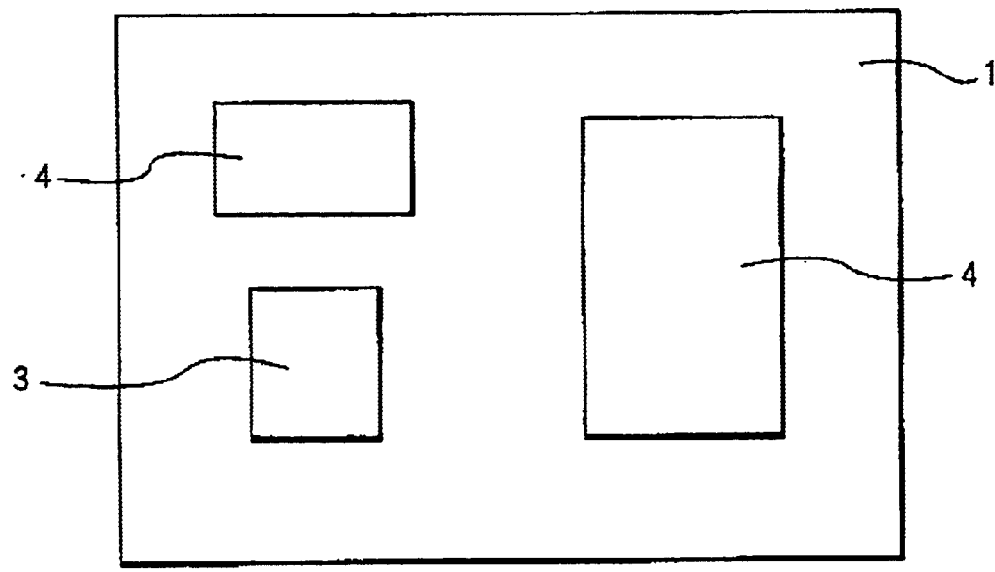
FIG. 1 depicts a multiple-chip package.
Figure 2:
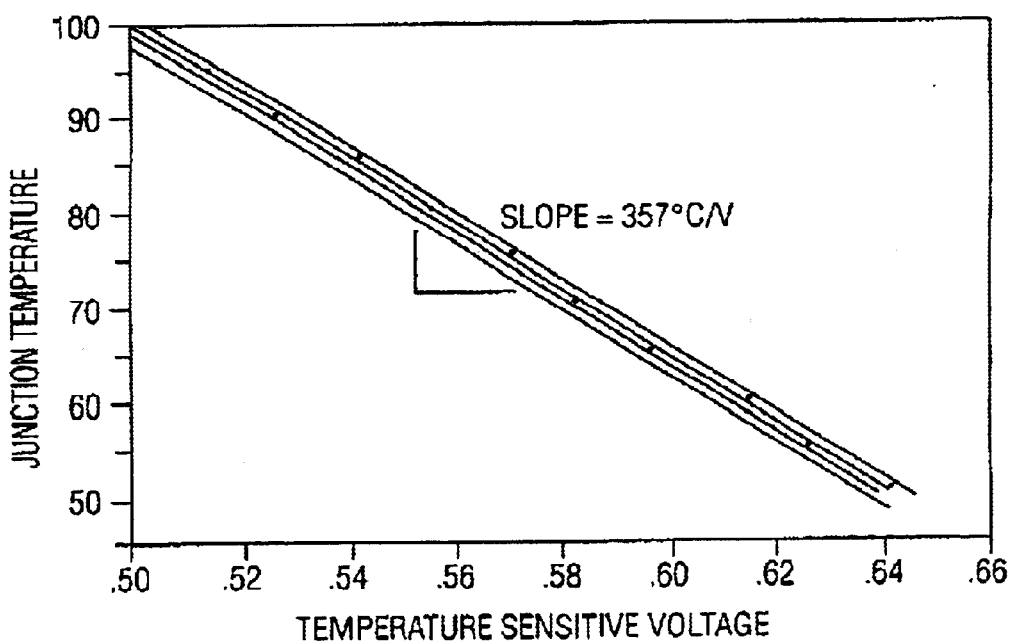
FIG. 2 depicts a graph showing the curve of junction temperature and a TSP.
Figure 3A:
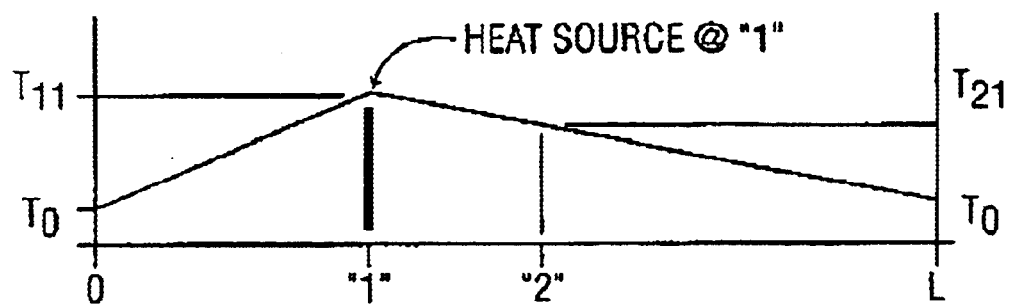
FIG. 3A depicts an illustration of a theoretical superposition where a first of two heat sources generates heat.
Figure 3B:
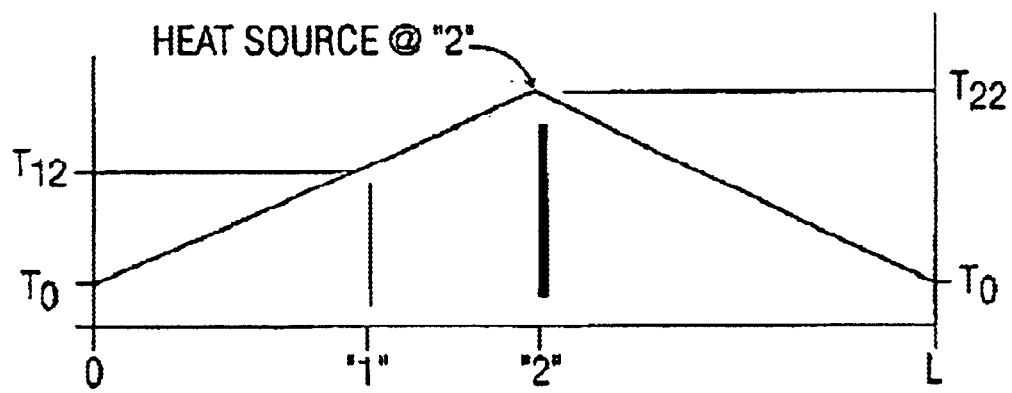
FIG. 3B depicts an illustration of a theoretical superposition where a second of two heat sources generates heat.
Figure 3C:
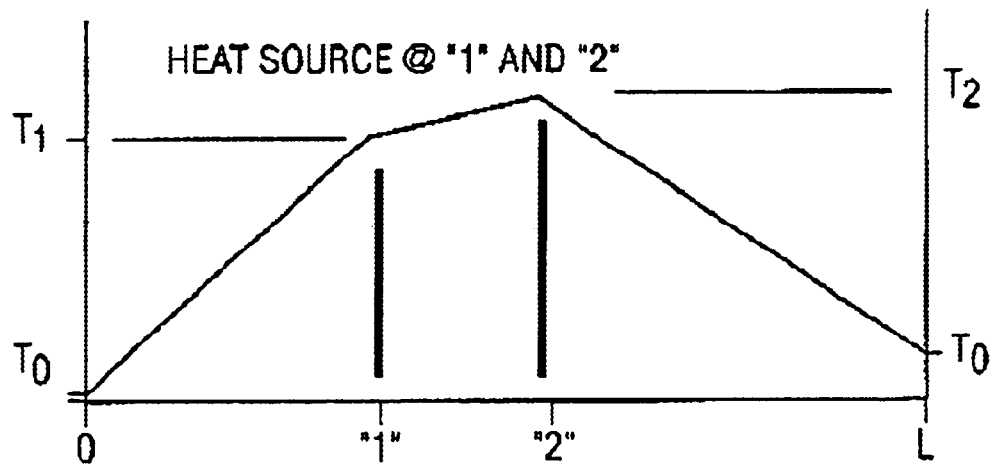
FIG. 3C depicts an illustration of a theoretical superposition used to determine junction temperature when both of two heat sources generate heat.
Figure 4:
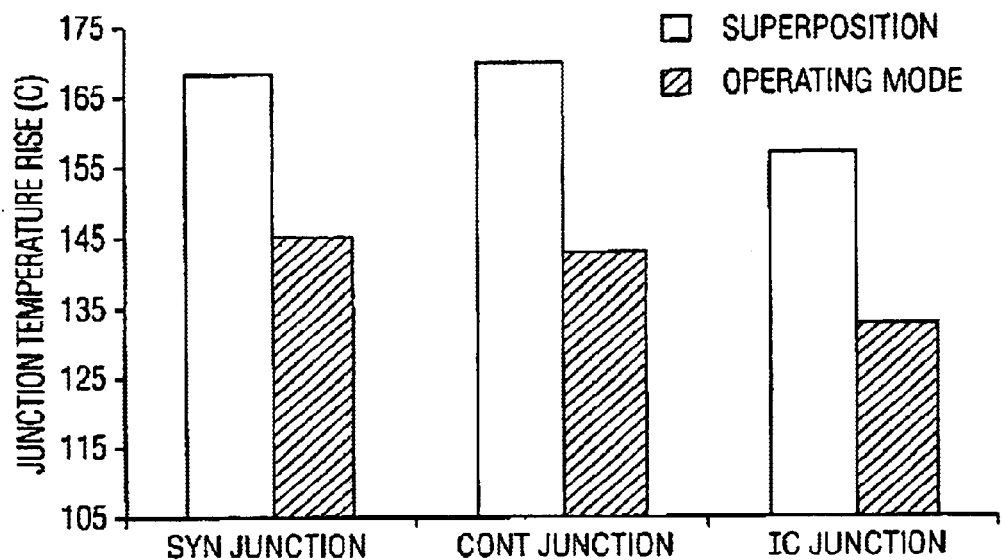
FIG. 4 depicts a chart comparing the results of junction temperatures generated using linear superposition in a test mode versus actual temperatures measured in operating mode.

FIG. 4 depicts a chart comparing the results of the above equations with measured junction temperatures in operating mode. Based on a simulation, $\Delta T_{ij}$ (i,j=1,2,3) can be calculated with, for example, a=50%, b=33.3% and c=16.7% (where a corresponds to a synchronous FET, b corresponds to a control FET, and c is an integrated circuit). In FIG. 4, the results from the linear superposition based on equation (1) were compared to the results with actual operating mode. The errors from the linear superposition are as large as 17%, which correspond to the temperature difference of 24° C. when the total power dissipation is 3.0 W. This is because that the system involved with the airflow and the radiation effect is virtually non-linear. According to FIG. 4, Syn Junction corresponds to device 2, Cont Junction corresponds to device 3, and IC junction corresponds to device 4.

According to the invention, the generating step includes the following governing equations of the system with the fluid flow and radiation:

The conservation of mass:

$$\frac{\partial \rho}{\partial t} + \frac{\partial}{\partial x_i}(\rho u_i) = 0 \quad (2)$$

The conservation of momentum:

$$\frac{\partial}{\partial t}(\rho u_j) + \frac{\partial}{\partial x_i}(\rho u_i u_j) = \frac{\partial}{\partial x_i}\left(\mu \frac{\partial u_j}{\partial x_i}\right) - \frac{\partial p}{\partial x_j} + S_j \quad (3)$$

and, the conservation of energy:

$$\frac{\partial}{\partial t}(\rho c_p T) + \frac{\partial}{\partial x_i}(\rho u_i T) = \frac{\partial}{\partial x_i}\left(k \frac{\partial T}{\partial x_i}\right) + P \quad (4)$$

where $\rho$ is the density; $u_i$ the velocity vector (i=1,2, and 3), p the pressure, T the temperature, Sj the body force, P the heat source, and $\mu$ is viscosity. The nonlinear effect of radiation can be written as:

$$-q = \alpha(T^4 - T_0^4) \quad (5)$$

where $\alpha$ is the coefficient of radiation and q is the heat flux through the radiation area, and $T_0$ is the ambient temperature.

Heat transfer occurs through the solid part of the system, i.e., the interior package. In this case, assuming that the thermal properties of package materials are linear, the governing equation can be re-written as:

$$\rho c_p \frac{\partial T}{\partial t} = k \frac{\partial}{\partial x_i}\left(\frac{\partial T}{\partial x_i}\right) + P(X) \quad (6)$$

with the following boundary conditions:

$$-k \frac{\partial T}{\partial n} = h(T - T_0) + \alpha(T^4 - T_0^4) \quad (7)$$

where h is the heat transfer coefficient, and T the temperature on the boundary. It can be seen that all non-linearity of the system appears at the solid/fluid boundary. This makes the problem simpler since the heat conduction inside is linear. When three chips generate heat simultaneously in operating mode, the heat source in equation (6) can be expressed as:

$$P(X) = P \cdot [a\delta(X_1) + b\delta(X_2) + c\delta(X_3)] \quad (8)$$

where P is the total amount of heat dissipation, a, b and c are the percentage ratios of power generation for synchronous FET, control FET and driver IC respectively. $X_1$, $X_2$ and $X_3$ mean the location of heat sources. Thus equation (6) can be re-written as:

$$\rho c_p \frac{\partial T}{\partial t} = k \frac{\partial}{\partial x_i}\left(\frac{\partial T}{\partial x_i}\right) + P \cdot [a\delta(X_1) + b\delta(X_2) + c\delta(X_3)] \quad (9)$$

For the single heating-source modes, assuming that the power level remains same as that with powering three chips simultaneously, the governing equations can be written as following, respectively, Powering synchronous FET with the total amount of P:

$$\rho c_p \frac{\partial T^{(1)}}{\partial t} = k \frac{\partial}{\partial x_i}\left(\frac{\partial T^{(1)}}{\partial x_i}\right) + P\delta(X_1) \quad (10)$$

Powering control FET with the total amount of P:

$$\rho c_p \frac{\partial T^{(2)}}{\partial t} = k \frac{\partial}{\partial x_i}\left(\frac{\partial T^{(2)}}{\partial x_i}\right) + P\delta(X_2) \quad (11)$$

Powering control IC with the total amount of P:

$$\rho c_p \frac{\partial T^{(3)}}{\partial t} = k \frac{\partial}{\partial x_i}\left(\frac{\partial T^{(3)}}{\partial x_i}\right) + P\delta(X_3) \quad (12)$$

where $T^{(1)}$, $T^{(2)}$ and $T^{(3)}$ are the temperature fields with heating single synchronous FET, control FET and driver IC respectively. Since the power magnitude is same as that when three chips are powered on, it is expected that the airflow caused by such a power is similar and the temperature on the majority of the solid boundaries including the attached board is same. With this assumption, the above three cases share the same boundary conditions with same h, T and $T_0$, as following $$-k \frac{\partial T}{\partial n_i} = h(T - T_0) + \alpha(T^4 - T_0^4) \quad (13)$$

Multiplying a, b and c to equations (10), (11) and (12) respectively, with the boundary conditions, as following $$\rho c \frac{\partial aT^{(1)}}{\partial t} = k \frac{\partial}{\partial x_i}\left(\frac{\partial aT^{(1)}}{\partial x_i}\right) + aP\delta(X_1) \text{ with} \quad (14)$$

$$-ak\frac{\partial T}{\partial n} = ah(T - T_0) + a\alpha(T^4 - T_0^4)$$

$$\rho c \frac{\partial bT^{(2)}}{\partial t} = k \frac{\partial}{\partial x_i}\left(\frac{\partial bT^{(2)}}{\partial x_i}\right) + bP\delta(X_2) \text{ with} \quad (15)$$

$$-bk\frac{\partial T}{\partial n} = bh(T - T_0) + b\alpha(T^4 - T_0^4)$$

$$\rho c \frac{\partial cT^{(3)}}{\partial t} = k \frac{\partial}{\partial x_i}\left(\frac{\partial cT^{(3)}}{\partial x_i}\right) + cP\delta(X_3) \text{ with} \quad (16)$$

$$-ck\frac{\partial T}{\partial n} = ch(T - T_0) + c\alpha(T^4 - T_0^4)$$

Summing up equations (14), (15) and (16):

$$\rho c_p \frac{\partial (aT^{(1)} + bT^{(2)} + cT^{(3)})}{\partial t} = \quad (17)$$

$$k \frac{\partial}{\partial x_i}\left[\frac{\partial (aT^{(1)} + bT^{(2)} + cT^{(3)})}{\partial x_i}\right] + P \cdot [a\delta(X_1) + b\delta(X_2) + c\delta(X_3)]$$

with $-(a+b+c)k\frac{\partial T}{\partial n} =$ $$(a+b+c)h(T - T_0) + (a+b+c)\alpha(T^4 - T_0^4)$$

Since a+b+c=1, and let $$T = aT^{(1)} + bT^{(2)} + cT^{(3)} \quad (18)$$

Equation (17) becomes exactly same as the equation (9). This implies that the solution of equation (12) can be obtained from equation (18) when $T^{(1)}$, $T^{(2)}$ and $T^{(3)}$ are known. Therefore the three junction temperatures can now expressed as according to equation (18):

$$\Delta T_1 = a\Delta T_{11} + b\Delta T_{12} + c\Delta T_{13}$$

$$\Delta T_2 = a\Delta T_{21} + b\Delta T_{22} + c\Delta T_{23} \quad (19)$$

$$\Delta T_3 = a\Delta T_{31} + b\Delta T_{32} + c\Delta T_{33}$$

Equation (19) is different from the traditional linear superposition, expressed by equation (1). The single-source temperatures $\Delta T_{ij}$ are defined differently, as indicated by the following:

$\Delta T_{11}$: temperature rise of synchronous FET with P W heating from synchronous FET $\Delta T_{21}$: temperature rise of control FET with P W heating from synchronous FET $\Delta T_{31}$: temperature rise of driver IC chip with P W heating from synchronous FET $\Delta T_{12}$: temperature rise of synchronous FET with P W heating from control FET $\Delta T_{22}$: temperature rise of control FET with P W heating from control FET $\Delta T_{32}$: temperature rise of driver IC chip with P W heating from control FET $\Delta T_{13}$: temperature rise of synchronous FET with P W heating from driver IC $\Delta T_{23}$: temperature rise of control FET with P W heating from driver IC $\Delta T_{33}$: temperature rise of driver IC chip with P W heating from driver IC which are obtained from the measurement with maintaining the same power level as the total power of three chips. And then, the percentage ratios a, b and c will be multiplied in equation (19).

Figure 5:
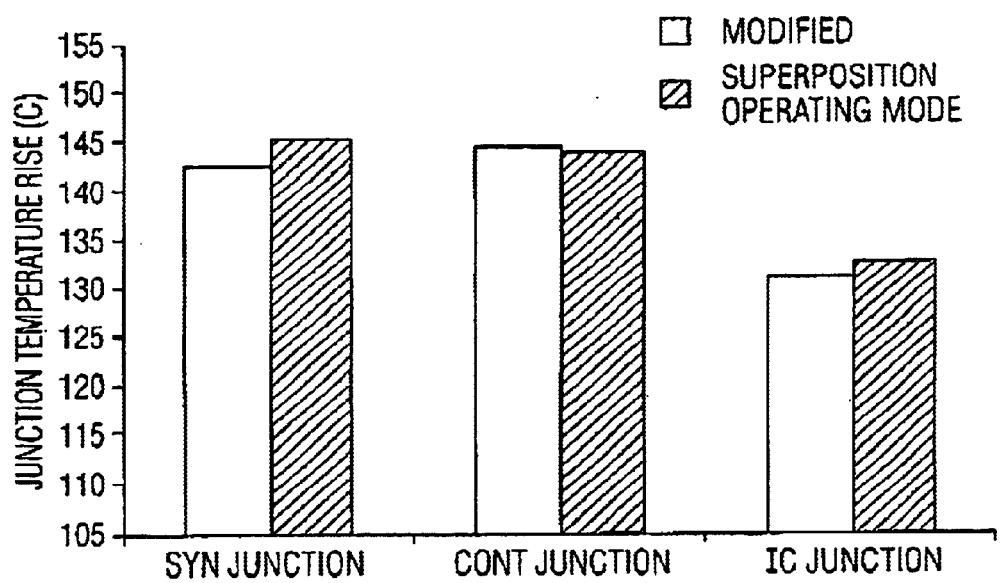
FIG. 5 depicts a chart comparing the results of junction temperatures generated using the modified superposition in a test mode to actual temperatures measured in operating mode.

In FIG. 5, the results from the modified superposition based on equation (19) were compared to the results with actual operating mode. It shows that the error is controlled well within 2%, compared to the 17% previously. This means that maintaining the same power level for different powering modes affect the temperature distributions inside the package greatly, but have little influences on the boundary temperatures and environmental conditions, excepting to the zone on the boundary that is very close to the heat sources. According to FIG. 5, Syn Junction corresponds to device 2, Cont Junction corresponds to device 3, and IC junction corresponds to device 4.

Figure 6:
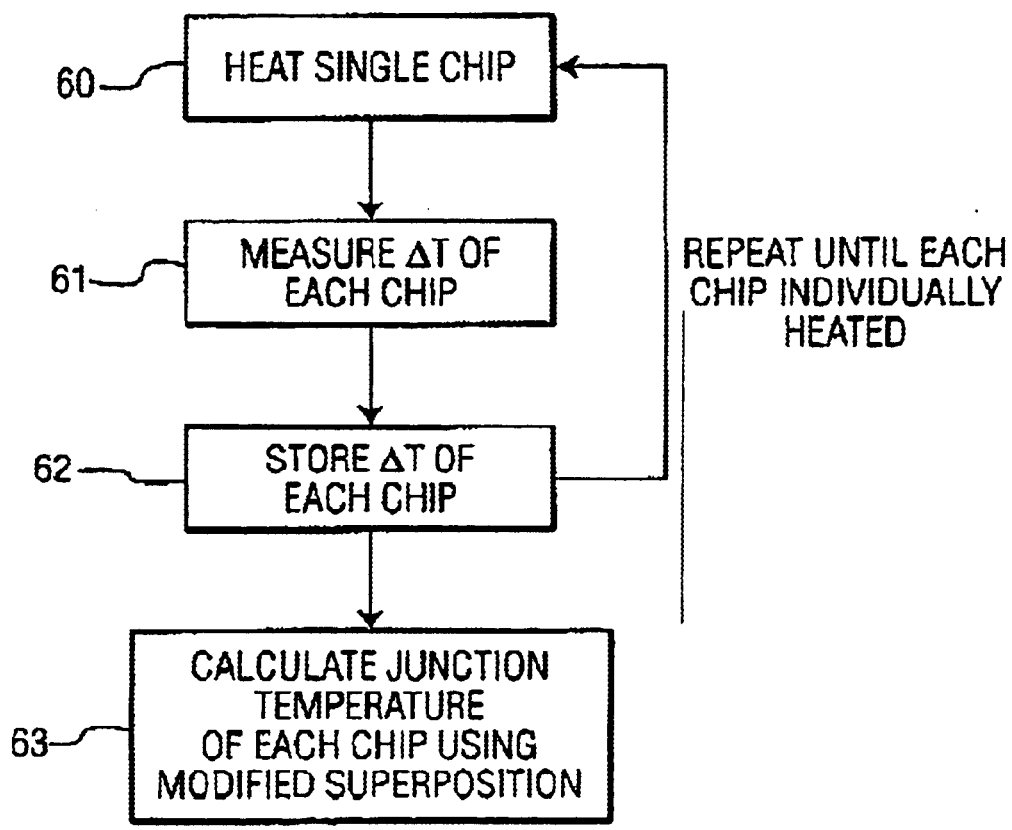
FIG. 6 depicts a block diagram of a method according to the invention.

FIG. 6 is a block diagram depicting a method according to the invention. Step 60 includes heating a single chip in a multiple-chip package. A device measures the change in temperature of each chip in the multiple-chip package using a temperature measuring technique known in the art in step 61. A memory, such as a microcomputer, stores the change in temperature of each chip in the multiple-chip package in step 62. This process is repeated until each chip in the multiple-chip package has been individually heated and steps 60–62 are completed for that cycle. Step 63 includes calculating the junction temperatures of each chip in the multiple-chip package from the test-mode using the modified superposition technique described above. This occurs, for example, by a junction temperature analysis module receiving the data stored in steps 62 and extracting the junction temperature of each chip in the multiple-chip package in the operation mode.

The junction temperatures generated in step 63 can also be used to calculate junction temperatures in various power distribution modes without repeating steps 60–62. In this case, the junction temperature analysis module receiving the same data stored in steps 62 and extracting the junction temperature of each chip in the multiple-chip package in the operation mode using the formulas above and simply adjusting the coefficients according to the different power loss distribution ratios to analyze the junction temperatures' dependence on a given power distribution ratio.

The preceding expressions and examples are exemplary and are not intended to limit the scope of the claims which follow.

What is claimed is:

1. A method of generating junction temperatures in a multiple-chip package comprising the steps of:
    heating a single chip in the multiple-chip package;
    measuring the change in temperature of each chip in the multiple-chip package;
    storing the measured temperature change of each chip;
    repeating the heating, measuring, and storing steps for each chip in the multiple-chip package; and
    generating the junction temperatures of each chip in the multiple-chip package when each chip is operating simultaneously based on the stored measured temperature changes and accounting for a non-linearity in a thermal system of the multiple-chip package based on power dissipation ratios of each chip.

2. The method of claim 1, wherein the heating step further comprises passing a current through the single chip.

3. The method of claim 1, wherein the measuring step further comprises measuring a temperature sensitive parameter of each chip.

4. The method of claim 1, wherein the measuring step further comprises passing a sensing current through each chip and measuring the voltage.

5. The method of claim 4, wherein the measured voltage is converted into a temperature measurement.

6. The method of claim 1, wherein the generating step further comprises calculating the junction temperature of each chip in the multiple-chip package when each chip is operating simultaneously by using an algorithm.

7. The method of claim 6, wherein the generating step further comprises calculating the junction temperature of each chip in the multiple-chip package when each chip is operating simultaneously by compiling single-source temperatures from the stored measured temperatures.

8. The method of claim 7, wherein the single-source temperatures further comprise a combination of multiple individual temperature rises of a single chip occurring when each chip is separately powered to give off heat during the heating, measuring, and repeating steps.

9. The method of claim 8, wherein the single-source temperatures further comprise multiplying each temperature rise of a single chip by the power dissipation ratio of the chip which is separately powered to give off heat.

10. The method of claim 9, wherein the single-source temperatures are entered into the algorithm and the junction temperature of each chip in the multiple-chip package when each chip is simultaneously operating is extracted.

11. A method of analyzing the dependence of junction temperatures in a multiple-chip package on power distribution ratios from a test-mode comprising the steps of:

heating a single chip in the multiple-chip package;

measuring the change in temperature of each chip in the multiple-chip package;

storing the measured temperature change of each chip;

repeating the heating, measuring, and storing steps for each chip in the multiple-chip package;

generating the junction temperatures of each chip in the multiple-chip package from the stored measured temperature changes and accounting for a non-linearity in a thermal system of the multiple-chip package based on a first power dissipation ratio of each chip; and generating the junction temperatures of each chip in the multiple-chip package from the stored measured temperature changes and accounting for a non-linearity in a thermal system of the multiple-chip package based on a second power dissipation ratio of each chip.

* * * * *